(12) United States Patent
Chun

(10) Patent No.: US 7,453,753 B2
(45) Date of Patent: Nov. 18, 2008

(54) SEMICONDUCTOR MEMORY APPARATUS

(75) Inventor: Jun-Hyun Chun, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 206 days.

(21) Appl. No.: 11/585,873

(22) Filed: Oct. 25, 2006

(65) Prior Publication Data

US 2007/0133332 A1 Jun. 14, 2007

(30) Foreign Application Priority Data

Dec. 8, 2005 (KR) ................ 10-2005-0119156

(51) Int. Cl.
*G11C 7/00* (2006.01)
(52) U.S. Cl. .................. 365/222; 365/233
(58) Field of Classification Search .......... 365/222, 365/233.1, 230.08
See application file for complete search history.

(56) References Cited

U.S. PATENT DOCUMENTS

| | | | |
|---|---|---|---|
| 5,894,446 A | 4/1999 | Itou | |
| 6,215,714 B1 * | 4/2001 | Takemae et al. | ............. 365/222 |
| 6,219,292 B1 * | 4/2001 | Jang | ............. 365/222 |
| 6,618,310 B2 | 9/2003 | Higashiho et al. | |
| 6,633,504 B1 * | 10/2003 | Lee et al. | ............. 365/222 |
| 6,707,744 B2 | 3/2004 | Jo | |
| 6,809,990 B2 | 10/2004 | Thomann et al. | |
| 6,847,570 B2 * | 1/2005 | Fujioka et al. | ............. 365/222 |
| 6,937,530 B2 | 8/2005 | Bell | |
| 6,937,534 B2 | 8/2005 | Lim et al. | |
| 6,954,388 B2 | 10/2005 | Thomann et al. | |
| 2005/0030818 A1 | 2/2005 | Raad | |

FOREIGN PATENT DOCUMENTS

JP 08147967 A 6/1996

* cited by examiner

*Primary Examiner*—Anh Phung
(74) *Attorney, Agent, or Firm*—Venable LLP; Jeffri A. Kaminski

(57) ABSTRACT

A semiconductor memory apparatus which can restrict a refresh operation for a period when an internal clock is synchronized with an external clock. The semiconductor memory apparatus includes a refresh control unit that disables a refresh command signal which is applied during a period when an enable signal is enabled but a lock-completion signal is not enabled in response to the enable signal outputted from a mode register, the lock-completion signal outputted from a clock synchronizing unit, and the refresh command signal outputted from a command decoder. The clock synchronizing unit can stably complete a locking operation within a predetermined time regardless of power-supply noise and so on.

11 Claims, 4 Drawing Sheets

SEMICONDUCTOR MEMORY APPARATUS

BACKGROUND

1. Technical Field

The present invention relates to a semiconductor memory apparatus, and more particularly, to a semiconductor memory apparatus that restricts a refresh operation while synchronizing an internal clock with an external clock.

2. Related Art

In general, semiconductor memory apparatuses use a DLL (Delay Locked Loop) or a PLL (Phase Locked Loop) as a clock synchronizer for compensating skew between data and a clock signal input from the outside or between an external clock signal and an internal clock signal.

For example, a DLL includes: an input buffer which receives and outputs an external clock signal; a delay unit which receives a clock signal output by the input buffer and outputs an internal clock signal which is delayed under the control of a phase detector; a delay modeling unit which delays the internal clock signal output by the delay unit on the basis of a modeling result according to a real path of the external clock signal, and outputs the delayed clock signal; and the phase detector which compares phases between an output signal of the delay modeling unit and an output signal of the input buffer.

When the clock signal output from the input buffer has the same phase as the output signal for the delay modeling unit, the delay unit does not adjust the delay time of the input clock signal, as a result, a locking operation is completed. The locking operation of the DLL should be performed within a predetermined time (for example, 200 cycles) after a DLL enable command and a DLL reset command are input.

In the semiconductor memory apparatus, after data is stored in memory cells, a leakage current occurs over time and data is lost as a result. For this reason, an operation for rewriting data, that is, a refresh operation should be performed.

FIG. 1 is a block diagram illustrating the construction of a general semiconductor memory apparatus.

As shown in FIG. 1, a clock buffer 110 receives an external clock signal CLK and an external clock enable signal CKE, converts the received signals into an internal clock signal ICLK and an internal enable signal ICKE each of which has a level suitable for an internal circuit, and outputs the internal signals. A command buffer 120 receives command signals /WE, /CAS, /RAS, and /CS from outside of the memory apparatus, converts the command signals into internal command signals each having a level suitable for the internal circuit, and outputs the internal command signals to a command decoder 140. An address buffer 130 receives address signals A0 to AN from the outside of the memory apparatus, converts the address signals into internal address signals each having a level suitable for the internal circuit, and outputs the internal address signals.

The command decoder 140 outputs an operation command signal CMD such as a refresh command signal REF, an active command signal (not shown), a pre-charge command signal (not shown), a write command signal (not shown), a read command signal (not shown), and so on, a mode-register-set command signal MRS_CMD, and an extended mode-register-set command signal EMRS_CMD by using the internal command signals received from the command buffer 120. The mode-register-set command signal MRS_CMD and the extended mode-register-set command signal EMRS_CMD become an input to a mode register 150.

The mode register 150 outputs a mode-register-setting signal MRS and an extended mode-register-setting signal EMRS (see FIG. 2) in response to output signals of the address buffer 130 and the mode-register-set command signal MRS_CMD and the extended mode-register-set command signal EMRS_CMD output from the command decoder 140. In particular, the extended mode-register-setting signal EMRS is used to drive the clock synchronizing unit 160, such as a DLL or a PLL, with an enable signal EN. The mode-register-setting signal MRS is used to reset the clock synchronizing unit 160 with a reset signal RESET (not shown). In response to the enable signal EN and the reset signal RESET inputted by the mode register 150, the clock synchronizing unit 160 completes a locking operation within a predetermined time and outputs a lock-completion signal LOCK and a synchronized clock signal LCLK.

The semiconductor memory apparatus performs a refresh operation on the basis of the refresh command signal REF among the command signals outputted from the command decoder 140.

In this way, the semiconductor memory apparatus according to the related art performs a refresh operation regardless of the operational state of the clock synchronizing unit 160. However, if the clock synchronizing unit 160 is reset and the refresh command signal is applied before the locking operation is completed, noise generated during the refresh operation can disturb the locking operation such that the locking operation cannot be completed within the predetermined time.

FIG. 2 is a timing diagram illustrating a refresh operation when the general semiconductor memory apparatus performs internal clock synchronization.

As shown in FIG. 2, when the enable signal EN of the extended mode-register-setting signal EMRS outputted from the mode register 150 is enabled, the clock synchronizing unit is driven. Furthermore, after the reset signal RESET of the mode-register-setting signal MRS is enabled, the clock synchronizing unit 160 should complete the locking operation within the predetermined time. However, the refresh command signal REF is applied from the command decoder 140 regardless of the above-mentioned operation of the clock synchronizing unit 160.

Therefore, when the clock synchronizing unit 160 is reset but the clock synchronizing unit 160 does not complete a locking operation, the refresh operation for the semiconductor memory apparatus is performed, thereby generating power supply noise. The power supply noise may make it difficult to smoothly complete the locking operation.

SUMMARY

Embodiments of the present invention have been proposed to solve the above-described problems. Embodiments of the present invention provide a semiconductor memory apparatus that can perform a locking operation in a stable state by restricting a refresh operation when a clock synchronizing unit is reset but the locking operation is not completed.

According to an embodiment of the present invention, a semiconductor memory apparatus includes a command decoder adapted to output a refresh command signal; a mode register-adapted to output an enable signal; a clock synchronizing unit adapted to output a lock completion signal; a refresh control unit coupled to the command decoder, the mode register and the clock synchronizing unit and adapted to disable the refresh command signal applied during a period when the enable signal is enabled but the lock-completion signal is not enabled, in response to the enable signal, the lock-completion signal, and the refresh command signal.

Here, it is preferable that the refresh control unit include a signal-detecting unit coupled to the clock synchronizing unit and the mode register and adapted to detect a period when the enable signal is enabled but the lock-completion signal is not enabled; and a refresh-command output unit adapted to disable the refresh command signal applied within the period detected by the signal-detecting unit and to pass the refresh command signal applied within the other period in response to an output signal of the signal-detecting unit and the refresh command signal.

According to another embodiment of the present invention, a semiconductor memory apparatus includes a command buffer adapted to receive an external command signal, convert the external command signal into an internal command signal having a level suitable for an internal circuit, and output the internal command signal; an address buffer adapted to receive an external address signal, convert the external address signal into an internal address signal having a level suitable for the internal circuit, and output the internal address signal; a command decoder coupled to the command buffer to receive the internal command signal and adapted to output a refresh command signal, a mode-register-set command signal, and an extended mode-register-set command signal; a mode register coupled to the command decoder to receive the mode-register-set command signal and the extended mode-register-set command signal and coupled to the address buffer to receive the internal address signal and adapted to output a mode register setting signal and an extended mode-register-setting signal including an enable signal; a clock synchronizing unit coupled to the mode register to receive and be driven by the enable signal, and is adapted to synchronize an internal clock signal with an external clock signal, and output a lock-completion signal and the synchronized internal clock signal when a locking operation is completed; and a refresh control unit adapted to receive the lock-completion signal outputted from the clock synchronizing unit, the enable signal outputted from the mode register, and the refresh command signal outputted from the command decoder and to disable the refresh command signal input during a period when the enable signal is enabled but the lock-completion signal is not enabled.

DESCRIPTION OF EXEMPLARY EMBODIMENT

Hereinafter, an embodiment of the present invention will now be described in detail with reference to the accompanying drawings.

Figure 1:
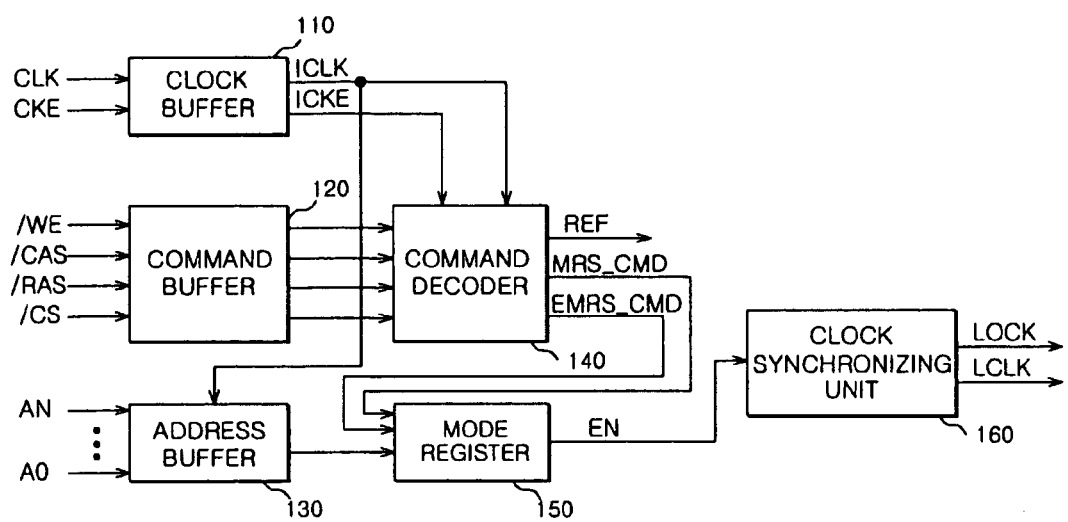
FIG. 1 is a block diagram illustrating the construction of a known semiconductor memory apparatus.
Figure 2:
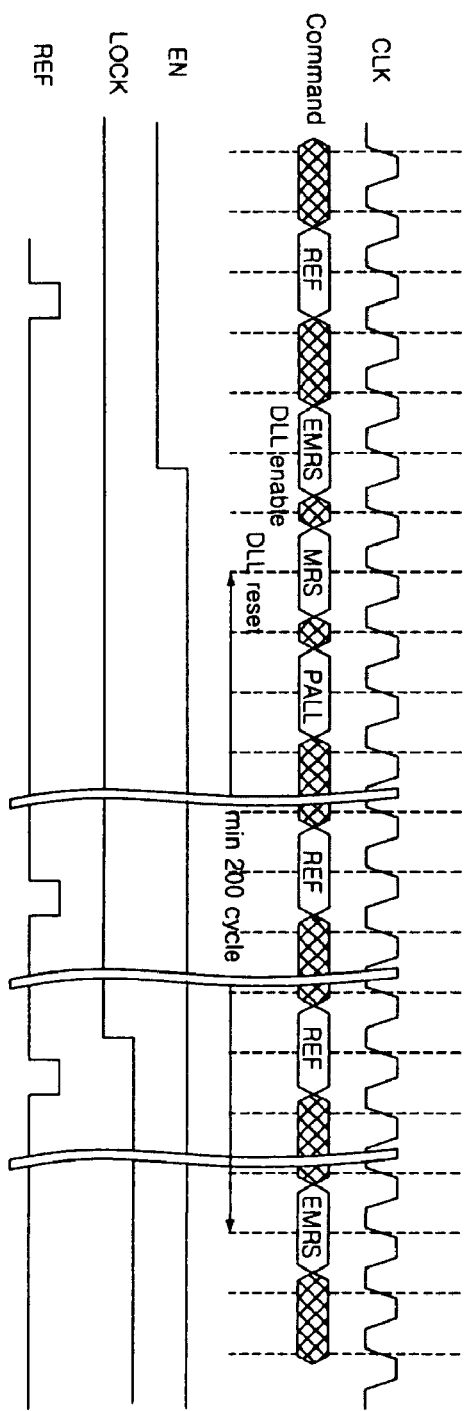
FIG. 2 is a timing diagram illustrating a refresh operation when the known semiconductor memory apparatus performs internal clock synchronization.
Figure 3:
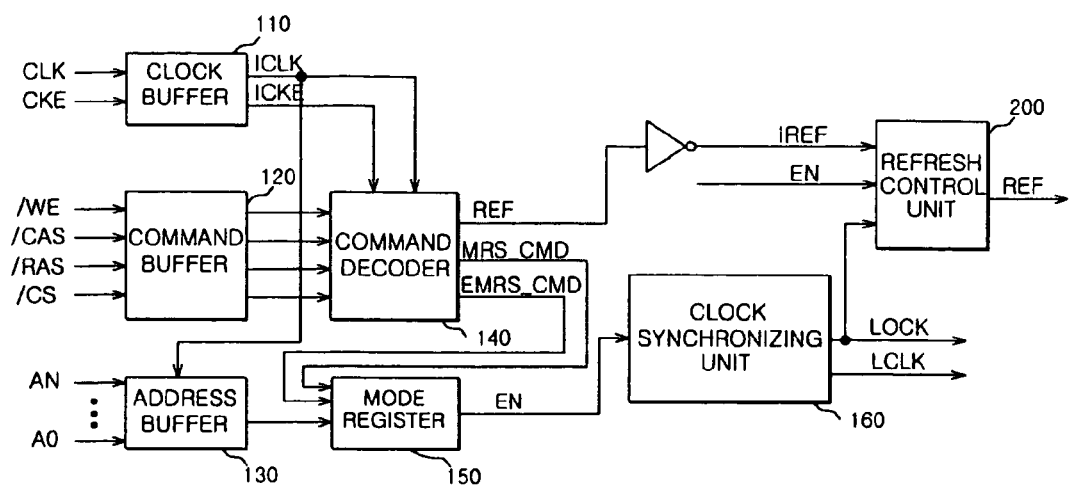
FIG. 3 is a block diagram illustrating a semiconductor memory apparatus according to an embodiment of the present invention.

FIG. 3 is a block diagram illustrating a semiconductor memory apparatus according to an embodiment of the present invention.

The semiconductor memory apparatus according to the present invention includes a clock synchronizing unit 160 and a refresh control unit 200. In response to an enable signal EN outputted from a mode register 150 and a lock-completion signal LOCK outputted from the clock synchronizing unit 160, and a refresh command signal IREF outputted from a command decoder 140, the refresh control unit 200 disables the refresh command signal IREF which is applied when the enable signal is enabled but the lock-completion signal LOCK is not enabled.

In particular, the semiconductor memory apparatus according to the disclosed embodiment of the present invention includes a clock buffer 110, a command buffer 120, an address buffer 130, a command decoder 140, a mode register 150, a clock synchronizing unit 160, and a refresh control unit 200. The clock buffer 110 receives an external clock signal CLK and an external clock enable signal CKE, converts the received external signals into internal clock signals ICLK and ICKE each having a level suitable for an internal circuit, and outputs the internal clock signals ICLK and ICKE. The command buffer 120 receives external command signals /WE, /CAS, /RAS, and /CS, converts the received external command signals into internal command signals each having a level suitable for the internal circuit, and outputs the internal command signals. The address buffer 130 receives external address signals A0 to AN, converts the received external address signals into internal address signals each having a level suitable for the internal circuit, and outputs the internal address signals. The command decoder 140 outputs an operation command signal CMD such as a refresh command signal REF, an active command signal (not shown), a pre-charge command signal (not shown), a write command signal (not shown), a read command signal (not shown), and so on, a mode-register-set command signal MRS_CMD, and an extended mode-register-set command signal EMRS_CMD by using the internal command signals received from the command buffer 120. The mode register 150 outputs a mode-register-setting signal MRS and an extended mode-register-setting signal EMRS in response to the internal address signal outputted from the address buffer 130 and the mode-register-set command signal MRS_CMD and the extended mode-register-set command signal EMRS_CMD outputted from the command decoder 140. The clock synchronizing unit 160 is driven by an enable signal EN outputted from the mode register 150 and outputs a synchronized clock signal LCLK and a lock-completion signal LOCK when a locking operation is completed. In response to the lock-completion signal LOCK outputted from the clock synchronizing unit 160, the enable signal EN outputted from the mode register 150, and a refresh command signal IREF outputted from a command decoder 140, the refresh control unit 200 disables the refresh command signal IREF which is applied when the enable signal is enabled but the lock-completion signal LOCK is not enabled.

In other words, when the clock synchronizing unit 160 such as a DLL or a PLL is enabled and the refresh control unit 200 receives a refresh command signal before a locking operation is completed, the refresh control unit 200 disables the refresh command signal so as not to perform the refresh operation. Therefore, the clock synchronizing unit 160 can stably complete the locking operation in an external circumstance.

Figure 4:
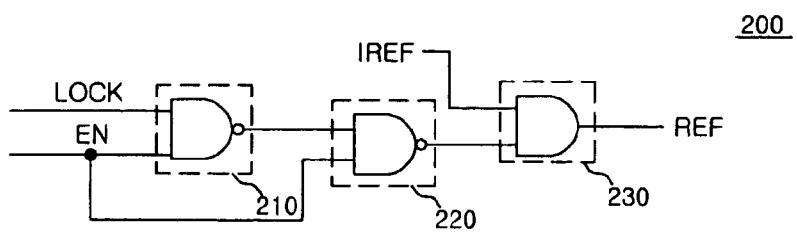
FIG. 4 is a circuit diagram specifically illustrating a refresh control unit of FIG. 3.

FIG. 4 is a circuit diagram specifically illustrating the refresh control unit of FIG. 3.

As shown in FIG. 4, the refresh control unit 200 has a first signal-detecting unit 210, a second signal-detecting unit 220, and a refresh-command output unit 230. In response to the lock-completion signal LOCK output from the clock synchronizing unit 160 and the enable signal EN output from the mode register 150, the first signal-detecting unit 210 detects a period in which the lock-completion signal becomes enabled. In response to an output signal of the first signal-detecting unit 210 and the enable signal EN, the second signal-detecting unit 220 detects a period when the enable signal is enabled but the lock-completion signal is not enabled. In response to an output signal of the second signal-detecting unit 220 and an refresh command signal IREF output from the command decoder 140, the refresh-command output unit 230 disables refresh command signals IREF applied in the period detected by the second signal-detecting unit 220 and passes refresh command signals IREF applied in the other period. When the output signal REF of the refresh-command output unit 230 is enabled, the semiconductor memory apparatus performs the refresh operation.

Here, the first and second signal-detecting units 210 and 220 are composed of, for example, NAND gates, and the refresh-command output unit 230 is composed of an AND gate. However, the individual parts are not limited thereto.

Figure 5:
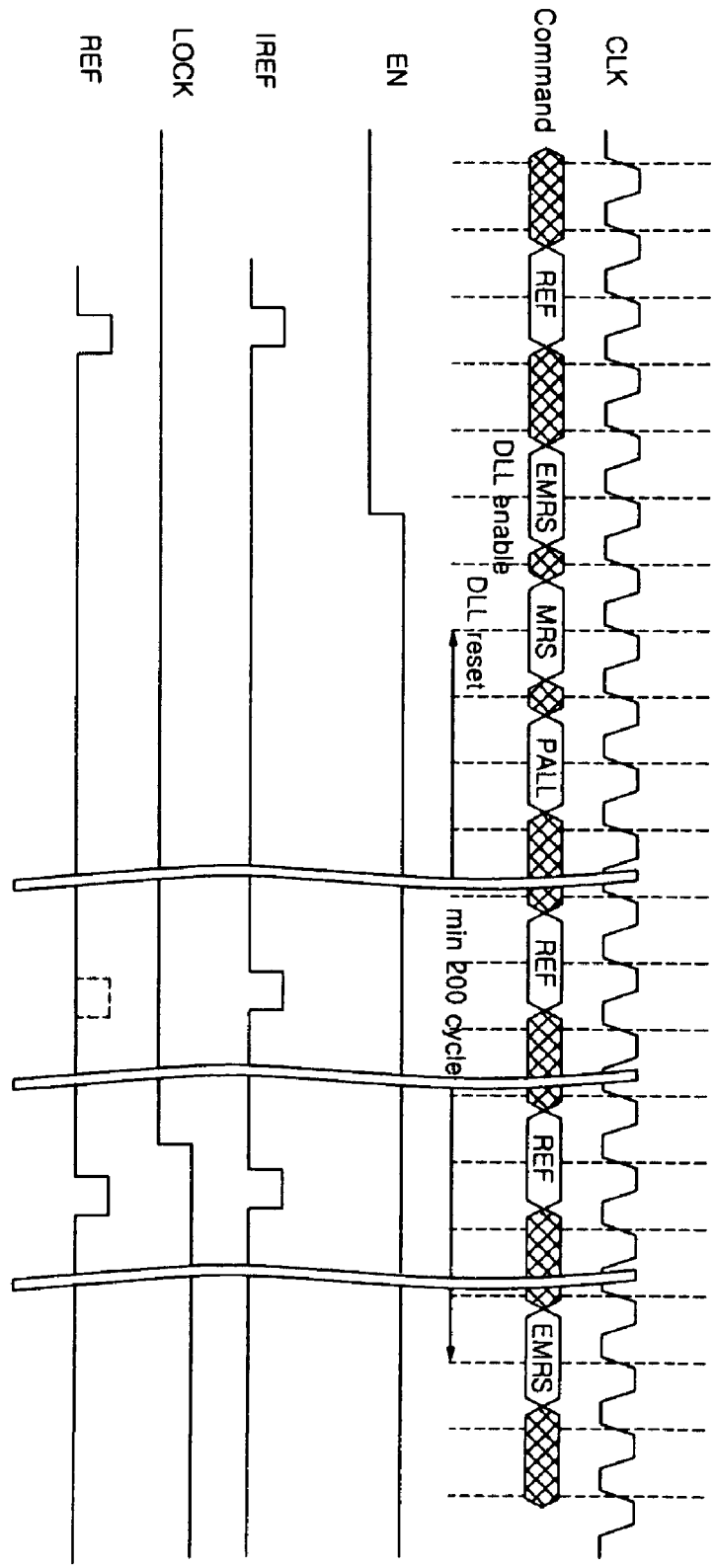
FIG. 5 is a timing diagram illustrating a refresh operation when the semiconductor memory apparatus having the refresh control unit according to an embodiment of the present invention performs internal clock synchronization.

FIG. 5 is a timing diagram illustrating a refresh operation when the semiconductor memory apparatus having the refresh control unit according to the described embodiment of the present invention performs internal clock synchronization.

As shown in FIG. 5, the refresh control unit 200 passes and outputs a refresh command signal IREF applied before the enable signal EN is enabled.

However, it is understood that the refresh control unit 200 disables a refresh command signal IREF which is applied when the enable signal EN is enabled but the lock-completion signal LOCK is not enabled so as not to output the refresh command signals IREF. Then, the refresh control unit 200 passes and outputs refresh command signals IREF applied after the lock-completion signal LOCK is enabled.

In other words, in embodiments of the present invention, the refresh operation is not performed when the clock synchronizing unit 160 is driven but the clock synchronizing unit 160 does not complete the locking operation. Accordingly, the clock synchronizing unit of the semiconductor memory apparatus can stably synchronize an external clock with an internal clock.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

In the semiconductor memory apparatus according to an embodiment of the present invention, a refresh signal is disabled when a clock synchronizing unit which generates an internal clock synchronized with an external clock is enabled but a locking operation is not completed. Therefore, the clock synchronizing unit can stably complete the locking operation within a predetermined time regardless of power-supply noise.

Accordingly, it is possible to quickly and exactly generate an internal clock signal synchronized with an external clock signal, thereby improving the reliability of the semiconductor memory apparatus.

What is claimed is:

1. A semiconductor memory apparatus comprising:
 a command decoder adapted to output a refresh command signal;
 a mode register-adapted to output an enable signal;
 a clock synchronizing unit adapted to output a lock completion signal;
 a refresh control unit coupled to the command decoder, the mode register and the clock synchronizing unit and adapted to disable the refresh command signal applied during a period when the enable signal is enabled but the lock-completion signal is not enabled, in response to the enable signal, the lock-completion signal, and the refresh command signal.

2. The semiconductor memory apparatus of claim 1, wherein the refresh control unit includes:
 a signal-detecting unit coupled to the clock synchronizing unit and the mode register and adapted to detect a period when the enable signal is enabled but the lock-completion signal is not enabled; and
 a refresh-command output unit adapted to disable the refresh command signal applied within the period detected by the signal-detecting unit and to pass the refresh command signal applied within the other period in response to an output signal of the signal-detecting unit and the refresh command signal.

3. The semiconductor memory apparatus of claim 2, wherein the signal-detecting unit includes:
 a first signal-detecting unit producing an output signal and having inputs respectively coupled to the clock synchronizing unit and the mode register and adapted to detect a period when the lock-completion signal is enabled in response to the lock-completion signal and the enable signal; and
 a second signal-detecting unit having inputs respectively coupled to the output of the first signal-detecting unit and the mode register and adapted to detect a period when the enable signal is enabled but the lock-completion signal is not enabled in response to the output signal of the first signal-detecting unit and the enable signal.

4. The semiconductor memory apparatus of claim 1, wherein the clock synchronizing unit is a DLL (delay locked loop).

5. The semiconductor memory apparatus of claim 1, wherein the clock synchronizing unit is a PLL (phase locked loop).

6. A semiconductor memory apparatus comprising:
 a command buffer adapted to receive an external command signal, convert the external command signal into an internal command signal having a level suitable for an internal circuit, and output the internal command signal;
 an address buffer adapted to receive an external address signal, convert the external address signal into an internal address signal having a level suitable for the internal circuit, and output the internal address signal;
 a command decoder coupled to the command buffer to receive the internal command signal and adapted to output a refresh command signal, a mode-register-set command signal, and an extended mode-register-set command signal;
 a mode register coupled to the command decoder to receive the mode-register-set command signal and the extended mode-register-set command signal and coupled to the address buffer to receive the internal address signal and adapted to output a mode register setting signal and an extended mode-register-setting signal including an enable signal;

a clock synchronizing unit coupled to the mode register to receive and be driven by the enable signal, and is adapted to synchronize an internal clock signal with an external clock signal, and output a lock-completion signal and the synchronized internal clock signal when a locking operation is completed; and a refresh control unit adapted to receive the lock-completion signal outputted from the clock synchronizing unit, the enable signal outputted from the mode register, and the refresh command signal outputted from the command decoder and to disable the refresh command signal input during a period when the enable signal is enabled but the lock-completion signal is not enabled.

7. The semiconductor memory apparatus of claim 6, wherein the refresh control unit includes:

a first signal-detecting unit producing an output signal and having inputs respectively coupled to the clock synchronizing unit and the mode register and adapted to detect a period when the lock-completion signal is enabled in response to the lock-completion signal and the enable signal;

a second signal-detecting unit having inputs respectively coupled to the output of the first signal-detecting unit and the mode register and adapted to detect a period when the enable signal is enabled but the lock-completion signal is not enabled in response to the output signal of the first signal-detecting unit and the enable signal; and a refresh-command output unit adapted to disable the refresh command signal applied within the period detected by the second signal-detecting unit and to pass the refresh command signal applied within the other period in response to an output signal of the second signal-detecting unit and the refresh command signal.

8. The semiconductor memory apparatus of claim 7, wherein the first and second signal-detecting units are NAND gates.

9. The semiconductor memory apparatus of claim 7, wherein the refresh-command output unit is an AND gate.

10. The semiconductor memory apparatus of claim 6, wherein the clock synchronizing unit is a DLL (delay locked loop).

11. The semiconductor memory apparatus of claim 6, wherein the clock synchronizing unit is a PLL (phase locked loop).

* * * * *